(12) United States Patent
Ivanov et al.

(10) Patent No.: US 7,848,134 B2
(45) Date of Patent: Dec. 7, 2010

(54) FB DRAM MEMORY WITH STATE MEMORY

(75) Inventors: Milena Ivanov, Unterhaching (DE);
Heinz Hoenigschmid, Poeking (DE);
Stefan Dietrich, Tuerkenfeld (DE);
Michael Markert, Augsburg (DE)

(73) Assignee: QIMONDA AG, Munich (DE)

( * ) Notice: Subject to any disclaimer, the term of this patent is extended or adjusted under 35 U.S.C. 154(b) by 191 days.

(21) Appl. No.: 12/178,407

(22) Filed: Jul. 23, 2008

(65) Prior Publication Data
US 2010/0020586 A1 Jan. 28, 2010

(51) Int. Cl.
*G11C 11/24* (2006.01)
(52) U.S. Cl. .................. 365/149; 365/150; 365/205; 365/206; 365/207
(58) Field of Classification Search .......... 365/149, 365/150, 205, 206, 207
See application file for complete search history.

(56) References Cited

U.S. PATENT DOCUMENTS

| | | | | |
|---|---|---|---|---|
| 7,072,205 B2 * | 7/2006 | Tang et al. | .................. | 365/150 |
| 7,230,846 B2 * | 6/2007 | Keshavarzi et al. | .......... | 365/177 |
| 7,391,640 B2 * | 6/2008 | Tang et al. | .................. | 365/150 |
| 7,433,223 B2 * | 10/2008 | Kim et al. | .................... | 365/149 |
| 7,542,345 B2 * | 6/2009 | Okhonin et al. | ........ | 365/185.18 |
| 2005/0068807 A1 | 3/2005 | Ohsawa | | |
| 2007/0019844 A1 | 1/2007 | Yumoto et al. | | |

* cited by examiner

*Primary Examiner*—Pho M Luu

(57) ABSTRACT

A memory chip with a plurality of FB DRAM cells, having a word line coupled to a first FB DRAM cell and a second FB DRAM cell is disclosed. The memory chip further has a first bit line coupled to the first FB DRAM cell, and a first state memory circuit coupled to the first bit line. The memory chip further includes a second bit line coupled to the second FB DRAM cell, and a second state memory circuit coupled to the second bit line. The memory chip further includes a sense amplifier, which can be coupled to the first FB DRAM cell, the second FB DRAM cell, the first state memory circuit or the second state memory circuit.

24 Claims, 8 Drawing Sheets

FB DRAM MEMORY WITH STATE MEMORY

TECHNICAL FIELD

Embodiments of the present invention relate to the data storage, such as in FB DRAM (floating body dynamic random access memory) or ZRAM (zero capacitor RAM) memories.

BRIEF DESCRIPTION OF THE DRAWINGS

Embodiments of the present invention will be detailed subsequently referring to the appended drawings, in which.

DETAILED DESCRIPTION OF ILLUSTRATIVE EMBODIMENTS

FB DRAM memories are dynamic memories in which the information may be stored in a body of an SOI (silicon on insulator) transistor. Here, in the so-called body, positive charges also referred to as holes, can be stored, wherein these may lead to a reduction in the threshold voltage of the transistor. If such a memory is read out, the transistor current, which is dependent on the positive charges stored in the body, may be assessed. Memory accesses thus can be done quickly, since the selection transistor concurrently corresponds to the memory element. Different ways of accessing an array of FB DRAM cells are possible. For example, this may be done through different gate voltages, via which it may then be determined whether it is to be written or read in a transistor, or if no action is to be taken on this transistor. However, this may result in the fact that, prior to the selection of a certain address, information on the type of access already is needed in a memory region, since the type of access is directly linked with the selection of the transistor or transistors.

The term FB DRAM may also be replaced by ZRAM in the following. The frequent use of the term FB DRAM is not to be understood in a limiting sense, the term ZRAM can be used synonymously.

Embodiments of the present invention may utilize state memories, which can be coupled as buffers between data lines and an FB DRAM memory region. Independently of the type of access to the memory region, embodiments may thus already transfer the contents of the memory region into the state memories, so that the state memories can be written to or read out in the actual access.

Figure 1:
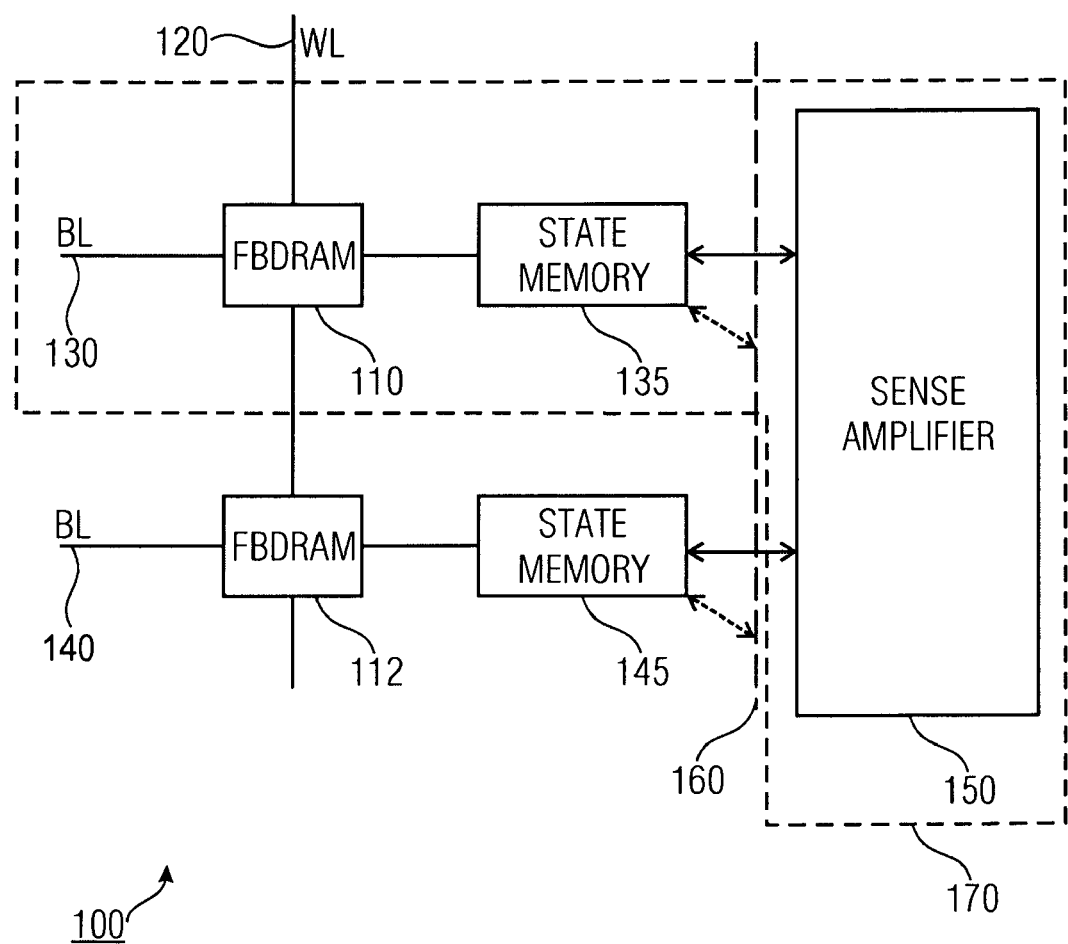
FIG. 1 shows an embodiment of a memory chip.

FIG. 1 shows an embodiment of a memory chip 100 with a plurality of FB DRAM cells, wherein only two cells 110 and 112 are illustrated exemplarily in FIG. 1. The memory chip 100 further includes a word line (WL) 120, which is coupled to the first FB DRAM cell 110 and the second FB DRAM cell 112. The memory chip 100 further comprises a first bit line (BL) 130, which is coupled to the first FB DRAM cell 110.

FIG. 1 further shows a first state memory circuit 135, which is coupled to the first bit line 130.

The embodiment of a memory chip 100 further shows a second bit line 140, which is coupled to the second FB DRAM cell 112, as well as a second state memory circuit 145, which is also coupled to the second bit line (BL) 140. The memory chip 100 further comprises a sense amplifier 150, which can be coupled to the first FB DRAM cell 110, the second FB DRAM cell 112, the first state memory circuit 135 or the second state memory circuit 145, which is indicated in FIG. 1 by the two-way solid arrows between the state memories 135 and 145, respectively, and the sense amplifier 150.

If the memory chip is accessed, the word line 120 may at first provide a read signal to the two FB DRAM cells 110 and 112. For example, the sense amplifier may at first be coupled to the bit line 130 and disconnected from the bit line 140. If the sense amplifier 150 is coupled to the bit line 130, it may evaluate the current through the FB DRAM cell 110, so that a signal reflecting the stored state of the FB DRAM cell 110 results at the output of the sense amplifier 150. The output of the sense amplifier 150 may then be coupled to the state memory 135, so that it now comprises the state of the FB DRAM cell 110. Subsequently, the sense amplifier 150 may again be disconnected from the bit line 130 and coupled to the bit line 140. The sense amplifier 150 may now make a corresponding current assessment of the FB DRAM cell 112, so that a signal reflecting the stored state of the stored FB DRAM cell 112 results at the output of the sense amplifier. The sense amplifier 150 may then be coupled to the state memory circuit 145, which then stores the stored state of the FB DRAM cell 112. The states stored in the two state memory circuits 135 and 145 may now be read out or written to externally, which is indicated by the dashed data line 160 and the dashed two-way mirrors between the data line 160 and the state memory circuits 135 and 145.

Up to this point, embodiments of the memory chip may also work without the knowledge whether there is to be a reading or writing access to the memory, and the measures just described may conversely already be begun before the information on the type of the access is present, if there is only the information as to on which cell the access will take place. Now there is the possibility to read out the state memory circuit 135 or 145, or manipulate the contents thereof, as it may be performed in a writing access.

The state memories 135 and 145 are coupled to the FB DRAM cells 110 and 112, respectively. If a write signal is applied to the word line 120, the FB DRAM cells 110 and 120 may take over the states stored in the state memory circuits 135 and 145, respectively.

The memory chip 100 could include several FB DRAM cells, wherein these may, for example, be subdivided into groups. In embodiments, the state memory circuits could then each be coupled to an FB DRAM cell of a group. In other words, in this case a state memory circuit could be coupled to an FB DRAM cell of a group each, so that the state memory circuits can be reused or switched for FB DRAM cells of different groups.

The plurality of FB DRAM cells could be formed to receive a read signal, a write signal or an idle signal on the word line, for example, the word line 120, wherein an FB DRAM cell may further be writable if the write signal is present on the word line, may be readable if the read signal is present on the word line, and may be neither readable nor writable if the idle signal is present on the word line. In realizations, these signals may, for example, be realized by mutually different voltages, as will be further explained in the following.

In embodiments, the state memory circuits may, for example, comprise two inversely coupled inverters, which may be connected together into a latch or also into a flip-flop. Furthermore, the FB DRAM cells may be subdivided into groups, wherein there may be a sense amplifier 150 for each group, so that different groups of FB DRAM cells can be coupled to different sense amplifiers. In other embodiments, a sense amplifier 150 could also be switched back and forth between individual groups of FB DRAM cells.

In a simple embodiment of a memory chip 100, it could also include only a single path, that is, a single bit line 130. Such an embodiment, for example, would be the memory chip 100 from FIG. 1 with an FB DRAM cell 110, a bit line 130 and a sense amplifier coupled to the bit line 130, wherein a state memory circuit 135 can be connected into the bit line 130 between the FB DRAM cell 110 and the sense amplifier 150. Such a simple embodiment is highlighted in FIG. 1 by a dashed box 170.

In embodiments, the FB DRAM cell 110 may further comprise a word line 120 and be formed to receive a read signal, a write signal or an idle signal at the word line 120, wherein the FB DRAM cell 110 may further be formed to provide a stored state on the bit line 130 if the read signal is present on the word line 120, store a state of the bit line 130 if the write signal is present on the word line 120, and neither store a state nor provide one on the bit line 130 if the idle signal is present on the word line 120.

States to be read or to be written can be buffered in the state memory circuits 135 in embodiments. External accesses may thus at first take place to the state memory circuits 135. If an access takes place before the type of access is known, the FB DRAM cell 110 can be coupled to the sense amplifier 150 in order to perform a current assessment of the coupled FB DRAM cell 110. In embodiments, a result of the current assessment may then be stored in the state memory circuit 135 by coupling the state memory circuit 135 to the output of the sense amplifier 150. Then the state memory circuit 135 may again be coupled to the FB DRAM cell 110, and the result of the current assessment of the FB DRAM cell 110, or a manipulated result, for example, in a write access, may be stored back into the FB DRAM cell 110.

Figure 2:
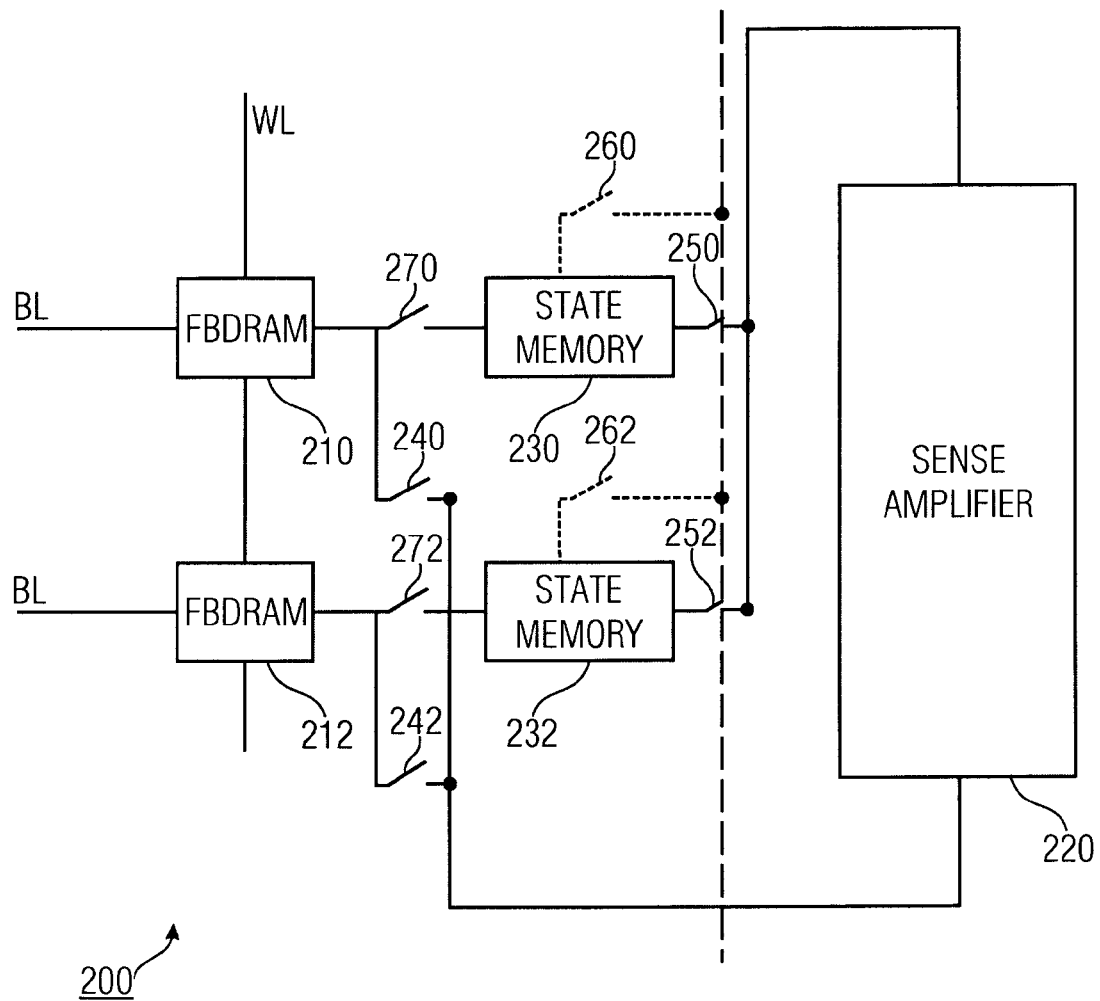
FIG. 2 shows a further embodiment of a memory chip.

FIG. 2 shows a further embodiment of a memory chip 200 with a first FB DRAM cell 210 and a second FB DRAM cell 212. The memory chip 200 further includes a sense amplifier 220 with an input, which can be coupled to the first FB DRAM cell 210 and the second FB DRAM cell 212, and an output. Furthermore, the memory chip 200 includes a first state memory 230, which can be coupled to the output of the sense amplifier 220 and the first FB DRAM cell 210, as well as a second state memory 232, which can be coupled to the output of the sense amplifier 220 and the second FB DRAM cell 212.

Between the individual components, FIG. 2 shows a series of switches, which can be used for coupling the components. Furthermore, FIG. 2 shows a word line (WL) and two bit lines (BL), which are connected to the FB DRAM cells 210 and 212. If an access to the memory chip 200 takes place, at first all switches are in the open position, as this is also illustrated in FIG. 2. If an access takes place, at first a read signal can be given onto the word line (WL), and the switch 240 can be closed. The input of the sense amplifier 220 then is connected to the first FB DRAM cell 210 and can make a current assessment. The sense amplifier 220 may then provide at its output a signal reflecting the state of the FB DRAM cell 210, and which may be taken over into the state memory 230 by closing the switch 250. The state memory 230 in turn is connected via the switch 260 to a data line, which is illustrated as a dashed line in FIG. 3. Access to the memory chip 200 may take place via the state memory by closing the switch 260. If the state read out from the FB DRAM cell 210 is in the state memory 230, the switches 250 and 240 can be opened again. By closing the switch 270, the state memory can be coupled to the FB DRAM cell. By applying a write signal to the word line (WL), a state can thus be taken over into the FB DRAM cell 210 from the state memory 230, be it the original state or a manipulated state.

An analog procedure would be possible in the embodiment of the memory chip 200 illustrated in FIG. 2 with respect to the FB DRAM cell 212. At first, it is assumed that all switches are open. By closing the switch 242, the FB DRAM cell can be connected to the input of the sense amplifier 220. The sense amplifier 220 may perform a current assessment and output same at its output, the output of the sense amplifier 220 may in turn be connected to the state memory 232 via the switch 252, so that now the state of the FB DRAM cell 212 can be stored there. The switches 242 and 252 may then be opened again. Access to the state memory may be done via the data line indicated in dashed manner and the switch 262. By closing the switch 272, the state memory 232 can be coupled to the FB DRAM cell 212, and by applying a write signal on the word line (WL), the state, be it the original or a manipulated state, can be taken over into the FB DRAM cell 212.

In embodiments, the FB DRAM cells 210 and 212 may thus be formed to take over a stored state when coupled to a state memory 230 and 232, respectively, if the FB DRAM cells 210 and 212 obtain a write signal.

In embodiments, hence, the state memories 230 and 232 may be formed to store a state of the output when coupled to the output of the sense amplifier 220.

In further embodiments, the sense amplifier 220 may be formed to perform a current assessment when coupled to an FB DRAM cell 210 or 212 and provide a signal based on the state of the FB DRAM cell 210 or 212 at the output.

In further embodiments, the memory chip 200 may further comprise an interface, which can be coupled to the state memories 230 or 232, and via which the state memories 230 and 232 are readable or writable.

Figure 3:
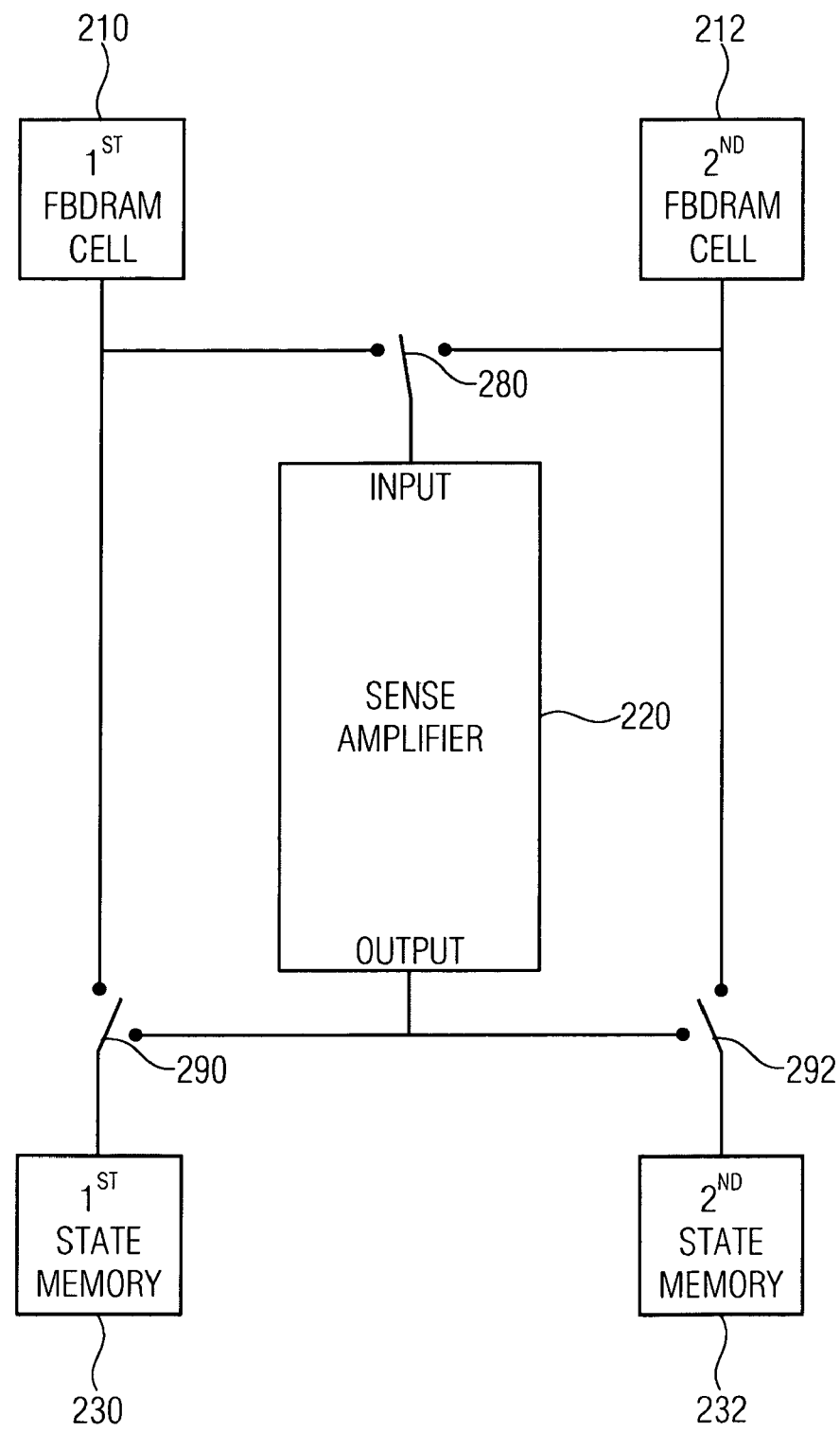
FIG. 3 shows a further embodiment of a memory chip.

FIG. 3 shows a block circuit diagram of a further embodiment of a memory chip 200. FIG. 3 shows a first FB DRAM cell 210 and a second FB DRAM cell 212, which can be connected to an input of the sense amplifier 220 via a switch 280. The output of the sense amplifier 220 may then selectively be connected to a first state memory 230 or a second state memory 232, wherein this may be done via the two switches 290 and 292 in FIG. 3.

For reading out the first FB DRAM cell 210, it is coupled to the input of the sense amplifier 220 via the switch 280, it may then perform a current assessment and provide an output signal based on a result of the current assessment at its output. The output of the sense amplifier 220 may then be connected via the switch 290 to a first state memory 230, which then stores the state of the FB DRAM cell 210. The state memory 230 may then be externally read out or manipulated. Via the switch 290, the state memory 230 can be coupled to the first FB DRAM cell 210, whereupon a state from the state memory 230 can be written into the FB DRAM cell 210. Analogous operations apply for the right side of FIG. 3, where the second FB DRAM cell 212 can be connected to the input of the sense amplifier 220 via the switch 280. The sense amplifier 220 may then perform a current assessment of the second FB DRAM cell 212 and provide a corresponding signal at its output. Via the switch 292, the output of the sense amplifier 220 may then be connected to the second state memory 232, in which then the state of the second FB DRAM cell 212 may the stored. In the second state memory 232, the state may then be read or manipulated. By switching over the switch 292, the second state memory 232 can be connected to the second FB DRAM cell 212 so as to store the state again.

Figure 4:
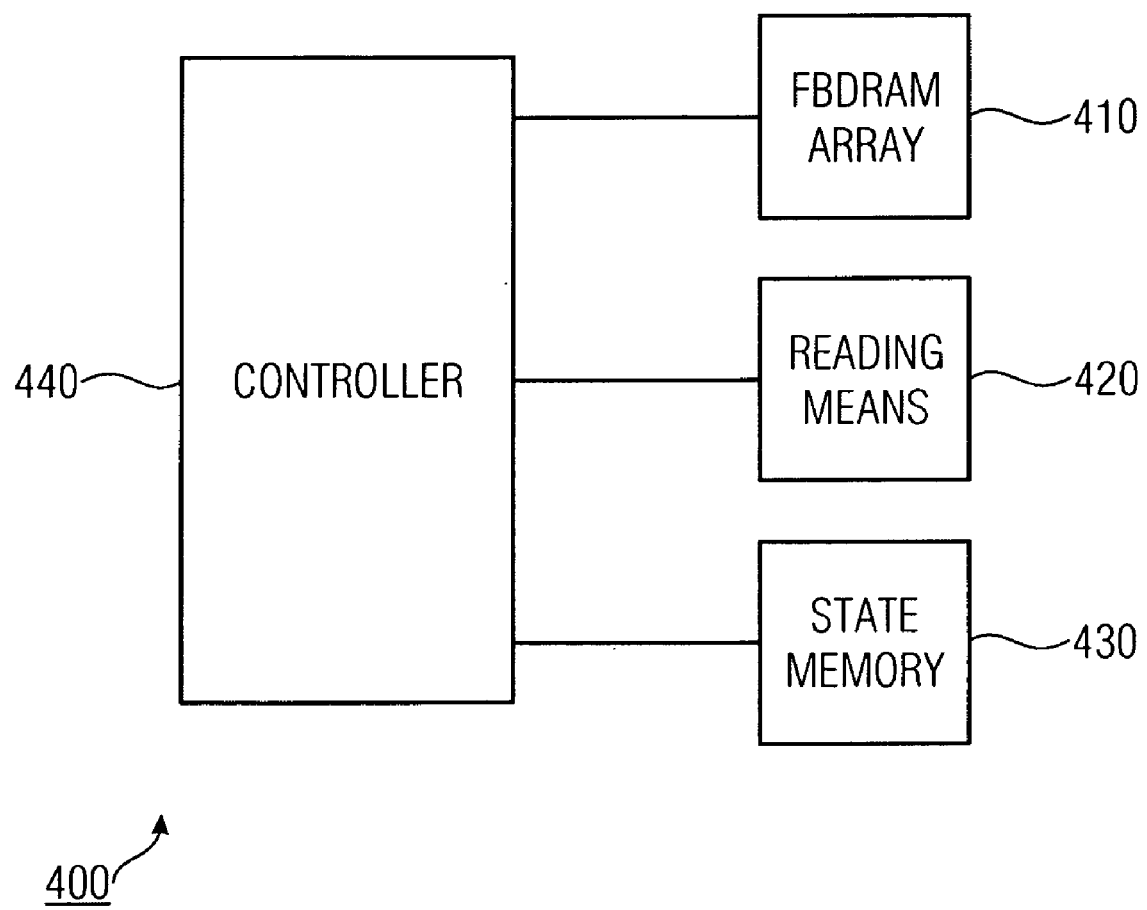
FIG. 4 shows a block circuit diagram of an embodiment of a memory chip.

FIG. 4 shows an embodiment of an apparatus 400 for exchanging binary data. The apparatus includes an FB DRAM array 410 with a plurality of FB DRAM cells 410, which may be addressable via a read signal, via a write signal or an idle signal.

The apparatus 400 includes a reading means 420 for determining a state of an FB DRAM cell. Furthermore, the apparatus 400 includes a plurality of state memories 430, wherein a state memory may be formed for storing a state of an FB DRAM cell. The apparatus 400 comprises a controller 440, which is formed for receiving an activation signal, an FB DRAM address of a read command or write command. The controller 440 is formed to control the FB DRAM array 410 at the FB DRAM address with the read signal upon reception of the activation signal and the FB DRAM address, and otherwise, i.e., at other addresses not corresponding to the FB DRAM address, control same with the idle signal, couple the reading means to the FB DRAM cells 410 of the FB DRAM array of the FB DRAM address and store the states of the FB DRAM cells 410 of the FB DRAM address in the state memories 430, wherein the controller 440 is further formed to provide the states from the state memories 430 when receiving the read command, and, when receiving the write command, to receive new states and store same in the state memories 430, couple the state memories 430 to the FB DRAM cells 410 of the FB DRAM address, and control the FB DRAM cells 410 of the FB DRAM address with the write signal.

The apparatus 400 may comprise state memories 430 that in turn include, e.g., two inversely coupled inverters. The state memories 430 may thus, for example, be realized as flip-flop or latch. The apparatus 400 may further comprise an interface for external communication of the state memories 430. Furthermore, in embodiments, the FB DRAM cells of the FB DRAM array 410 may be formed to receive various voltages as read signal, write signal or idle signal.

Figure 5:
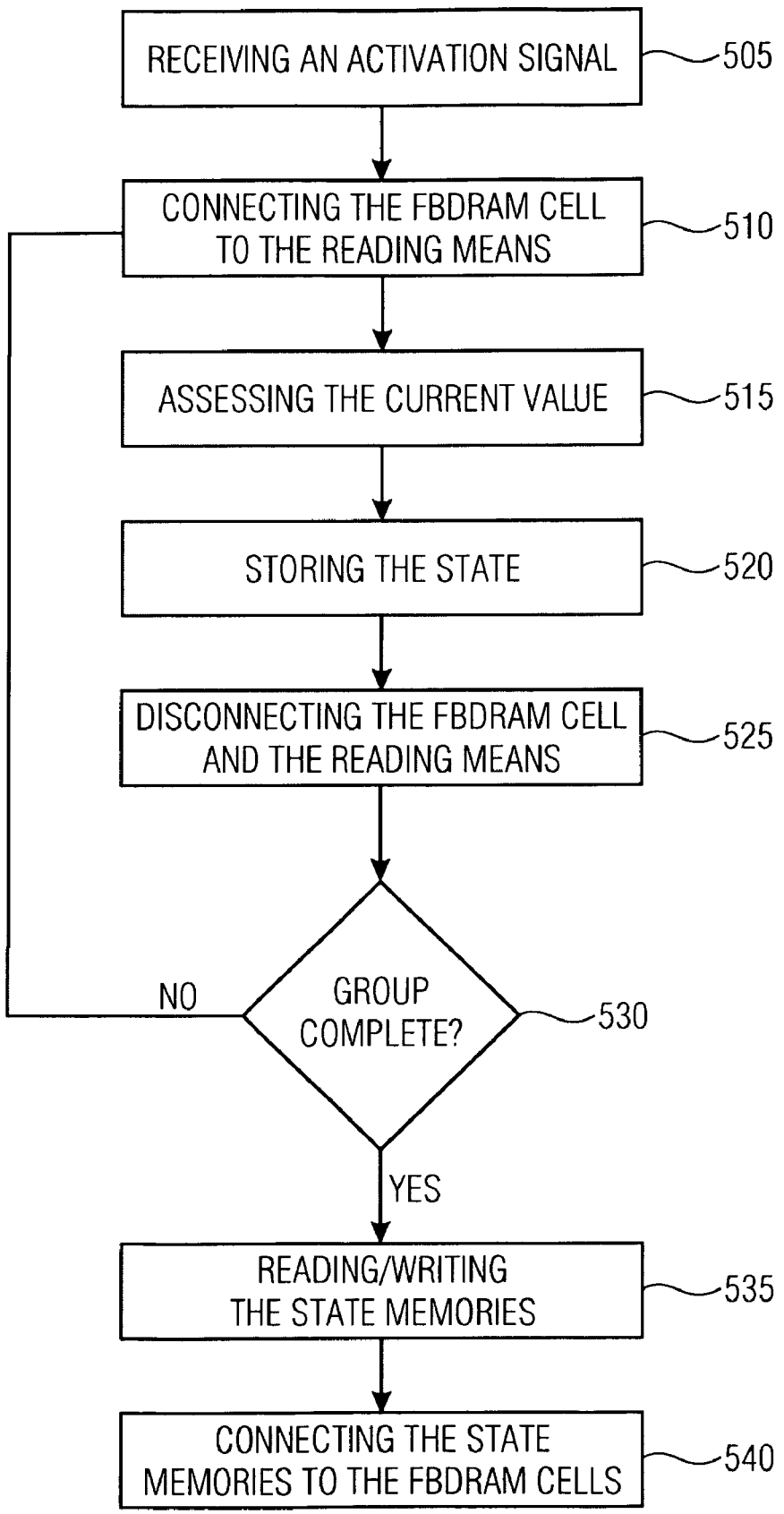
FIG. 5 shows a flow chart of an embodiment of a method for exchanging data.

FIG. 5 shows a flow chart of an embodiment of a method for exchanging data with an FB DRAM array. The method, for example, begins with a step 505 of receiving an activation signal. The step is followed by a loop, which realizes sequential readout of a group of FB DRAM cells. The loop begins with a step 510 of connecting the FB DRAM cell to an input of a reading means. Subsequently, in a step 515, a current assessment of the FB DRAM cell may be performed by a state of an output signal of the reading means. In the next step 520, the state of the output signal of the reading means can be stored in a state memory. Subsequently, the FB DRAM cell can be disconnected from the input of the reading means in a step 525. If the group is read out completely, the step 530 is followed by reading or writing the state memory in the step 535. If the group of the FB DRAM cells has not yet been read out completely, step 530 is again followed by the step 510 for connecting the next FB DRAM cell of the group to the reading means etc. The step of reading or writing the state memory 535 may then be followed by connecting the state memory to the FB DRAM cells in step 540.

In embodiments, the step of connecting the FB DRAM cells to the input of the reading means may be followed or preceded by a step of providing a read voltage to the FB DRAM cell. In general, in embodiments, the step of sequentially reading out, that is the loop in FIG. 5, may take place periodically, for example, within the scope of a refresh cycle. Then, but also in other embodiments, the step of connecting the state memories 540 to the FB DRAM cells may be followed or preceded by a step of providing a write voltage to the FB DRAM cell.

There are several ways of operating an array of FB DRAM cells. In the so-called "snap-back" variant, for example, the gate voltage of a transistor, the gate of which is, for example, connected to the word lines (WL), can, for example, take on three states. In embodiments, for example, a voltage of about $U1=-1.1$ V for reading, about $U2=1.5$ V for writing and about $U3=-1.4$ V for the idle, i.e., the inactive state, could be used. FB DRAMs may, for example, be different in this property with respect to other DRAMs, where the information may, for example, be stored in a capacitance connected to a selection transistor. As already mentioned above, this can mean that the type of access should be known prior to the memory access. Furthermore, it is to be noted that, when a word line is brought into a write state, the data of the bit lines is taken over, that is it should be in the desired state, because otherwise wrong data might be stored into the cells.

Figure 6:
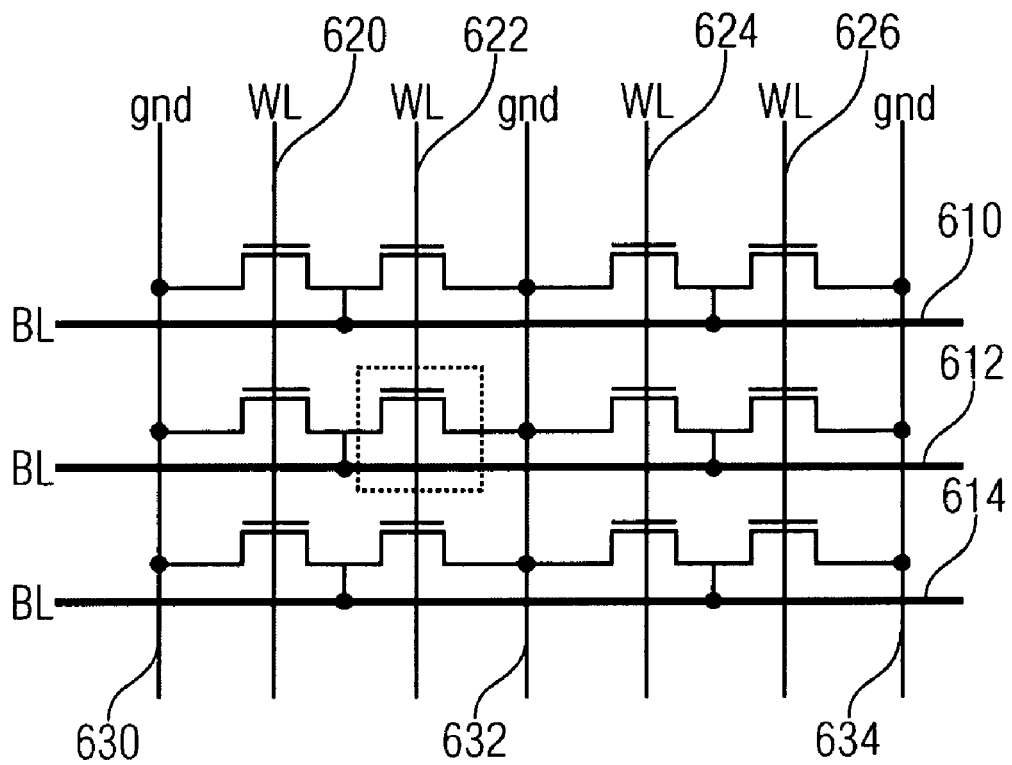
FIG. 6 shows an embodiment of an FB DRAM memory cell arrangement.

FIG. 6 illustrates an embodiment of an FB DRAM memory cell arrangement. In the upper part of FIG. 6, an FB DRAM cell structure can be seen, wherein three bit lines 610, 612 and 614 run horizontally. Along each of the three bit lines 610, 612 and 614 illustrated, there are four transistors each, the gates of which are each coupled to the four word lines 620, 622, 624 and 626. Furthermore, FIG. 6 shows three reference potential lines 630, 632 and 634 in the arrangement. In the lower part of FIG. 6, there is further illustrated a table that associates corresponding voltages on the word lines (WL) and bit lines (BL), respectively, with the four actions of writing a zero (write "0"), writing a 1 (write "1"), reading out ("read") and idle ("idle"). Embodiments generally are not limited to the designated values, the designated values only represent an example for illustrating the procedure in FB DRAM cells.

Reading out FB DRAM cells may, for example, be based on the evaluation of the cell current, wherein current evaluation circuits may generally be bulky and do not lead to an "on-pitch" layout. Furthermore, by the current evaluation, an unfavorably high power level on a memory chip may result if many FB DRAM cells are read out at the same time, because the corresponding currents add. FB DRAMs may be regarded as volatile memories in an embedded region and also as a smaller cell alternative for stand-alone memories. Embodiments allow for a DRAM-compatible interface for FB DRAM memory chips. For communication, in embodiments, DRAM-specific commands may thus be implemented in an FB DRAM architecture.

Embodiments may, for example, provide for the fact that, upon an activation signal, the word lines are already brought to a voltage level provided for reading out the FB DRAM cells. Here, in embodiments, all cells belonging to a word line may be read. Embodiments allow sequential reading for those cells sharing the same read circuit, for example, a sense amplifier. Embodiments thus permit the temporal distribution of the current on the memory chip, since the individual memory cells are read out sequentially. This may lead to more favorable power levels as compared with other systems. In embodiments, the results of the sequential read out may then be stored into parallel state memories or latches. In embodiments, further reading and writing may now take place from these latches or state memories, wherein this may take place with the same speed as it is usually enabled by other DRAMs. In embodiments, after reading out the FB DRAM cell states, the word line can also be brought into the write state, which may enable a refresh function (refresh operation).

Figure 7:
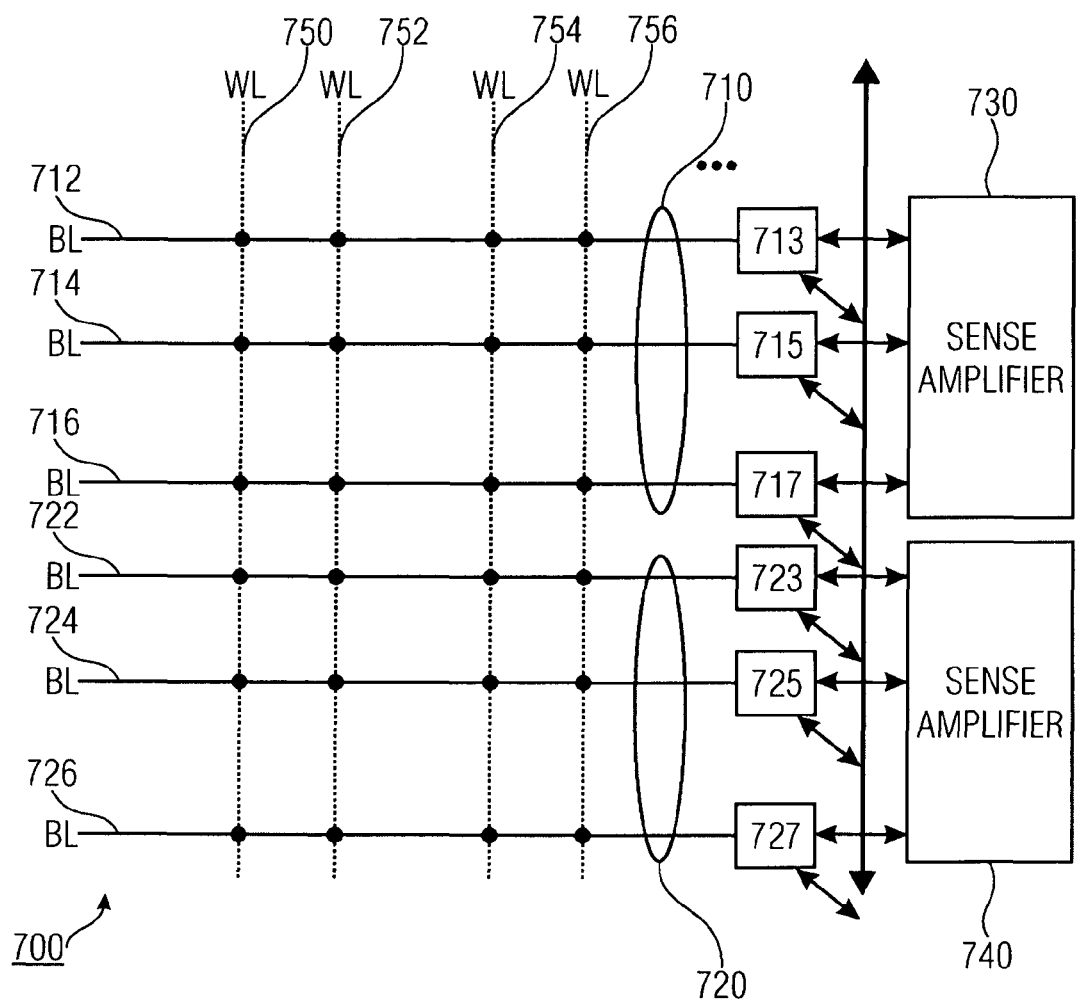
FIG. 7 shows a schematic arrangement of a plurality of FB DRAM memory cells in an FB DRAM array.

FIG. 7 shows a further embodiment of a memory chip 700. In the upper part, the memory chip 700 includes a group 710 of bit lines 712, 714 and 716. The number of bit lines here is only exemplarily illustrated as three, memory chips may in general also include any other numbers of bit lines. Furthermore, in the lower part, a second group 720 of bit lines 722, 724 and 726 is illustrated. In the upper part of the memory chip 700, there also is a state memory 713, 715 and 717 for each bit line, wherein the state memories may, for example, also be realized as a latch. In the lower group 720, the state memories are designated with 723, 725 and 727. For each group, FIG. 7 further shows a sense amplifier 730 and 740, respectively. Furthermore, in FIG. 7, four word lines 750, 752, 754 and 756 are illustrated.

FIG. 7 illustrates that bit lines, e.g., 712, 714 and 716, which belong to an array segment, can be divided into a group 710. The bit lines in one group may share one and the same reading circuit, that is a sense amplifier 730. In further embodiments, the read amplifiers 730 may also be switched between groups of adjacent array segments. This is not illustrated in FIG. 7. Embodiments may, however, also provide for the fact that, for example, the sense amplifier 730 can be switched to the place of the sense amplifier 740 via switches, wherein then the sense amplifier 740 could be omitted. Furthermore, FIG. 7 shows that a state memory is associated with each bit line. In embodiments, bit lines from adjacent array segments may optionally share a state memory. This also is not shown in the embodiment of FIG. 7, but it would be possible for the state memory 713 to be switched into another segment via a switch, unless the bit line 712 is used.

Figure 8:
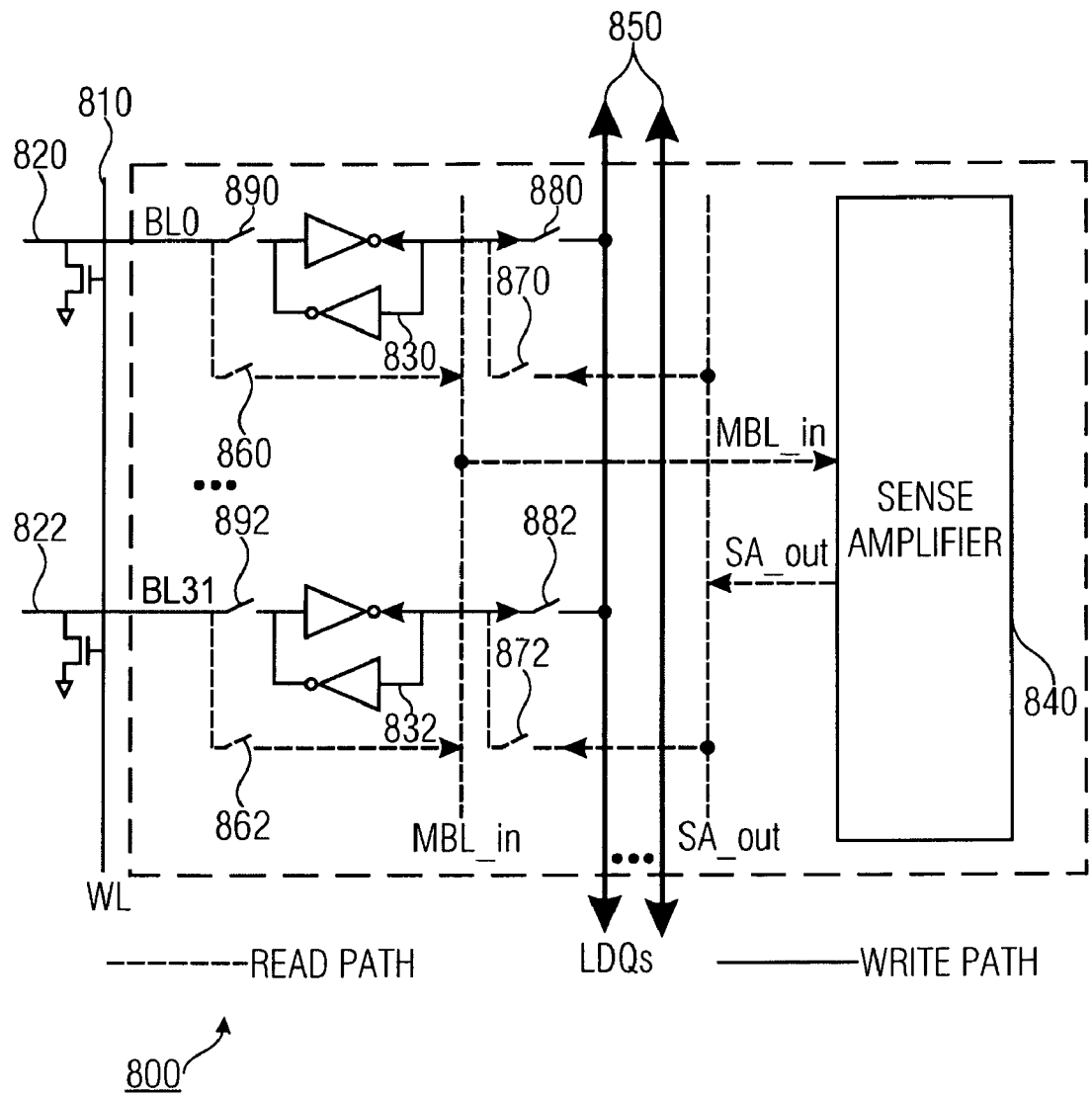
FIG. 8 shows a realization of an embodiment of a memory chip.

FIG. 8 shows an excerpt of a realization of an embodiment of a memory chip 800. FIG. 8 shows a word line 810, as well as two bit lines 820 and 822, wherein in the embodiment of FIG. 8 32 bit lines are assumed, and the bit line 820 corresponds to the first bit line and the bit line 822 to the $32^{nd}$ one, which is also indicated in FIG. 8 by the designations BL0 and BL31. FIG. 8 further shows two state memories 830 and 832, which can be coupled into the bit lines 820 and 822, respectively, and which are realized in form of latches with inversely coupled inverters. FIG. 8 further shows a sense amplifier 840, the input of which also is designated with MBL_in, its output being designated with SA_out. Furthermore, FIG. 8 shows a data line 850, as well as a plurality of switches, which will be explained in greater detail in the following. At first, it is to be assumed that all switches are open.

If an activation signal is received, all 32 bit lines or FB DRAM cells are to be read out sequentially in this embodiment. To this end, at first a read signal is given onto the word line 810. By closing the switch 860, the bit line 820 can be connected to the input of the sense amplifier 840. At the output of the sense amplifier 840, then a signal, which reflects the state of the bit line 820 and which can be coupled to the state memory 830 via the switch 870, is available. Thus, the state of the bit line 820 can be stored in the state memory 830. Subsequently, the switches 860 and 870 can be opened again.

In a next step, the subsequent bit lines can be read out in analog manner. At the example of the bit line 820, thus the switch 862 is closed in order to connect the bit line 822 to the input of the sense amplifier 840. The sense amplifier may then be coupled to the state memory 832 with the switch 872 so as to store the state of the bit line 822 in the state memory 832. Subsequently, the two switches 862 and 872 can be opened again. In order to be able to read out the states from the state memories 830 and 832 now, these can be connected to the corresponding data lines 850 via the switches 880 and 882, respectively. In the same manner, data may also be written from the data lines 850 into the state memories 830 and 832, respectively. By opening the switches 880 and 882, respectively, the state memories may then again be disconnected from the data lines 850.

By closing the switches 890 and 892, respectively, and applying a write signal to the word line 810, the FB DRAM cells may now again be written to, be it for refresh reasons or for storing new data.

Following the protocols of the DRAMs, the functioning of an embodiment may also be described with DRAM commands. For example, the ACT (activation signal) command is received. On the basis of the embodiment of FIG. 8, all 32 bit lines may then be, e.g., sequentially read with the same read circuit, that is the sense amplifier 840, and the corresponding data stored in the hold latches, that is the state memories 830 to 832. In embodiments, this operation could take place, for example, in parallel in all blocks the bit lines of which belong to the same page. The sequence may, for example, consist of several steps. Subsequently, an iteration will be described on the basis of the bit line 820, this sequence can be performed for all 32 bit lines in an analogous manner. It is assumed that all switches are open at first and the switch 860 is closed then. Thus, the bit line 820 is connected to the sense amplifier 840, so that it can assess the current value of the FB DRAM cell.

Subsequently, the switch 860 is switched off again, and the switch 870 is switched on. The output of the sense amplifier 840 may thus be stored in the hold latch, i.e., the state memory 830. Now the switch 870 may be opened again, and the switch 890 may be closed. Thus, the state memory 830 now is connected to the bit line 820. If the word line 810 is brought to a write voltage at the end of this read operation, a refresh of the page can be performed in embodiments.

Optionally, in other embodiments, the word line could be brought to the idle state at the end of the read operation. Writing back the data could, for example, be performed during a precharge command. A read command may thus be performed in embodiments similar to other DRAMs. The data lines 850, or data bus, can be connected to the latches, i.e., the state memories 830, via the switches 880, and thus the data can be made available. In embodiments, a write command may now take place by taking over data of the data line 850 into the corresponding state memories 830. In one embodiment, the data may then actually be written into the cells, when the word line 810 is brought to the write state. Otherwise, the writing back could also take place in the precharge. A memory refresh then, for example, could only take place by an activation signal or an activation signal and a precharge signal. Optionally, in the embodiment, during a precharge command, the switches 890 could be activated, and the word line 810 could be brought into the write state.

Embodiments of memory chips thus may replace DRAMs, since they may have the same command structure and thus may be made compatible. Furthermore, embodiments can be operated in a more power-efficient manner due to the state memory used, which may allow for sequential readout of the FB DRAM cells with only one sense amplifier, since the cell currents can be distributed temporally. Furthermore, embodiments may provide a higher access speed, since it may not need to wait for whether data is written or read. In embodiments, the data may already be held in the state memories upon arrival of this command.

In particular, it is pointed out that, depending on the conditions, the inventive scheme may also be implemented in software. The implementation may be on a digital storage medium, in particular a floppy disc, a CD, a DVD or the like, with electronically readable control signals capable of cooperating with a programmable computer system so that the corresponding method is executed. In general, the invention may thus also be implemented in a computer program product with a program code stored on a machine-readable carrier for performing the inventive method, when the computer program product is executed on a computer. In other words, the invention may thus be realized as a computer program with a program code for performing the method, when the computer program product is executed on a computer.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

What is claimed is:

1. A memory chip with a plurality of FB DRAM cells, the memory chip comprising:
   a word line coupled to a first FB DRAM cell and a second FB DRAM cell;
   a first bit line coupled to the first FB DRAM cell;
   a first state memory circuit coupled to the first bit line;
   a second bit line coupled to the second FB DRAM cell;
   a second state memory circuit coupled to the second bit line; and
   a sense amplifier, which can be coupled to the first FB DRAM cell, the second FB DRAM cell, the first state memory circuit or the second state memory circuit.

2. The memory chip according to claim 1, wherein the plurality of FB DRAM cells is subdivided into groups, and the first and second state memory circuits each can be coupled to an FB DRAM cell of a group.

3. The memory chip according to claim 1, wherein the plurality of FB DRAM cells is configured to receive a read signal, a write signal or an idle signal from the word line, and wherein an FB DRAM cell is writable if the write signal is present at the word line, is readable if the read signal is present at the word line, and is neither readable nor writable if the idle signal is present at the word line.

4. The memory chip according to claim 1, wherein the first state memory circuit comprises two inversely coupled inverters.

5. The memory chip according to claim 1, wherein the plurality of FB DRAM cells is subdivided into groups, and the FB DRAM cells of different groups can be coupled to different sense amplifiers.

6. A memory chip comprising:
   an FB DRAM cell;
   a bit line; and
   a sense amplifier, which can be coupled to the bit line, wherein a state memory circuit can be switched into the bit line between the FB DRAM cell and the sense amplifier, wherein the FB DRAM cell comprises a word line and is configured to receive a read signal, a write signal or an idle signal at the word line, and wherein the FB DRAM cell is further configured
      to provide a stored state on the bit line if the read signal is present at the word line,
      to store a state of the bit line if the write signal is present at the word line, and
      to neither store a state nor provide same at the bit line if the idle signal is present at the word line.

7. The memory chip according to claim 6, wherein the sense amplifier can be coupled to the FB DRAM cell, and wherein the sense amplifier is configured to perform a current assessment of a coupled FB DRAM cell.

8. The memory chip according to claim 7, wherein a state memory circuit can be coupled to the sense amplifier so as to store a result of the current assessment.

9. The memory chip according to claim 8, wherein the state memory circuit can be coupled to the FB DRAM cell so as to provide the result of the current assessment of the FB DRAM cell.

10. A memory chip comprising:
    a first FB DRAM cell;
    a second FB DRAM cell;
    a sense amplifier with an input, which can be coupled to the first FB DRAM cell and the second FB DRAM cell, and an output;
    a first state memory, which can be coupled to the output of the sense amplifier and the first FB DRAM cell; and
    a second state memory, which can be coupled to the output of the sense amplifier and the second FB DRAM cell.

11. The memory chip according to claim 10, wherein the first and second FB DRAM cells are configured to take over a stored state when coupled to a state memory if the first and second FB DRAM cells further obtain a write signal.

12. The memory chip according to claim 10, wherein the first and second state memories are configured to store a state of the output when coupled to the output of the sense amplifier.

13. The memory chip according to claim 10, wherein the sense amplifier is configured to perform a current assessment when coupled to an FB DRAM cell, and to provide a signal based on the state of the first and second FB DRAM cells at the output.

14. The memory chip according to claim 10, further comprising an interface, which can be coupled to the first and second state memories, and via which the first and second state memories are readable and/or writable.

15. An apparatus for exchanging binary data, the apparatus comprising:
    an FB DRAM array with a plurality of FB DRAM cells, which can be addressed via a read signal, a write signal or an idle signal;
    a reading means for determining a state of an FB DRAM cell;
    a plurality of state memories, wherein a state memory of the plurality of state memories is configured for storing a state of an FB DRAM cell; and
    a controller for receiving an activation signal, an FB DRAM address, a read command or a write command, wherein the controller is configured to control the FB DRAM array at the FB DRAM address with the read signal upon reception of the activation signal and the FB DRAM address, and otherwise with the idle signal, to couple the reading means to the FB DRAM cells of the FB DRAM array of the FB DRAM address, and to store the states of the FB DRAM cells of the FB DRAM address in the state memories, and wherein the controller is further configured to provide the states from the state memories when receiving the read command, and to receive new states and store same in the state memories when receiving the write command, to couple the state memories to the FB DRAM cells of the FB DRAM address and to control the FB DRAM cells of the FB DRAM address with the write signal.

16. The apparatus according to claim 15, wherein the state memories comprise two inversely coupled inverters.

17. The apparatus according to claim 15, wherein a state memory comprises a flip-flop or a latch.

18. The apparatus according to claim 15, further comprising an interface for external communication with the state memory.

19. The apparatus according to claim 15, wherein the FB DRAM cells are configured to receive various voltages as a read signal, a write signal and an idle signal.

20. A method for exchanging data with an FB DRAM array, the method comprising:
- receiving an activation signal;
- sequentially reading out a group of FB DRAM cells, comprising:
  - connecting an FB DRAM cell to an input of a reading means;
  - assessing a current value of the FB DRAM cell through a state of an output signal of the reading means;
  - storing the state of the output signal in a state memory;
  - disconnecting the FB DRAM cell from the input;
  - reading out or writing to state memories; and
  - connecting the state memories to the FB DRAM cells.

21. The method according to claim 20, wherein connecting the FB DRAM cell to the input of the reading means is followed or preceded by providing a read voltage to the FB DRAM cell.

22. The method according to claim 20, wherein sequentially reading out takes place periodically.

23. The method according to claim 20, wherein connecting the state memories to the FB DRAM cells is followed or preceded by providing a write voltage to the FB DRAM cells.

24. A computer program for performing, when the computer program is executed on a computer, a method for exchanging data with an FB DRAM array, the method comprising:
- receiving an activation signal;
- sequentially reading out a group of FB DRAM cells, comprising:
  - connecting an FB DRAM cell to an input of a reading means;
  - assessing a current value of the FB DRAM cell through a state of an output signal of the reading means;
  - storing the state of the output signal in a state memory;
  - disconnecting the FB DRAM cell from the input;
  - reading out or writing to state memories; and
  - connecting the state memories to the FB DRAM cells.

* * * * *